United States Patent
Shang et al.

(10) Patent No.: US 11,909,216 B2
(45) Date of Patent: Feb. 20, 2024

(54) SIGNAL MEASUREMENT METHOD FOR ENERGY STORAGE AND FREQUENCY MODULATION SYSTEM

(71) Applicant: Optim (Shanghai) New Energy Co., Ltd., Shanghai (CN)

(72) Inventors: Dehua Shang, Shanghai (CN); Wei Jia, Shanghai (CN)

(73) Assignee: OPTIM (SHANGHAI) NEW ENERGY CO., LTD., Shanghai (CN)

( * ) Notice: Subject to any disclaimer, the term of this patent is extended or adjusted under 35 U.S.C. 154(b) by 329 days.

(21) Appl. No.: 17/429,052

(22) PCT Filed: Nov. 6, 2019

(86) PCT No.: PCT/CN2019/115913
§ 371 (c)(1),
(2) Date: Aug. 6, 2021

(87) PCT Pub. No.: WO2021/068320
PCT Pub. Date: Apr. 15, 2021

(65) Prior Publication Data
US 2022/0131385 A1    Apr. 28, 2022

(30) Foreign Application Priority Data
Oct. 12, 2019   (CN) .......................... 201910968839.7

(51) Int. Cl.
*H02J 3/46* (2006.01)
*G01R 21/133* (2006.01)
(Continued)

(52) U.S. Cl.
CPC .............. *H02J 3/46* (2013.01); *G01R 21/133* (2013.01); *G05B 15/02* (2013.01); *H02J 3/32* (2013.01);
(Continued)

(58) Field of Classification Search
CPC .. H02J 3/46; H02J 3/32; G01R 21/133; G01R 19/2513; G05B 15/02; H04L 27/0014;
(Continued)

(56) References Cited

U.S. PATENT DOCUMENTS

| | | | |
|---|---|---|---|
| 2015/0380934 A1 | 12/2015 | Patterson et al. | |
| 2016/0127619 A1* | 5/2016 | Witherspoon | A45C 5/14 348/86 |

(Continued)

FOREIGN PATENT DOCUMENTS

| | | |
|---|---|---|
| CN | 102830277 A | 12/2012 |
| CN | 209046262 U | 6/2019 |

OTHER PUBLICATIONS

International Search Report dated Jun. 30, 2020, issued in application No. PCT/CN2019/115913.

*Primary Examiner* — Mohammad Ali
*Assistant Examiner* — Saad M Kabir
(74) *Attorney, Agent, or Firm* — McClure, Qualey & Rodack, LLP

(57) ABSTRACT

Disclosed is a signal measurement method for an energy storage and frequency modulation system. An energy management system consisting of a microgrid controller, an energy management server, a workstation, and a network device is provided. The beneficial effects of the present invention are: a high-voltage auxiliary transformer based on an energy storage system connected to a power plant is used as the auxiliary output device of a generator set to satisfy the requirements of auxiliary frequency regulation, improve the response index Kp value of a power plant set to a dispatch AGC instruction, implement the sending and receiving of a signal after the energy storage system is connected, and (Continued)

achieves the goal of frequency modulation operation of an auxiliary energy storage set without greatly transforming an RTU.

6 Claims, 1 Drawing Sheet

(51) Int. Cl.
    *G05B 15/02*     (2006.01)
    *H02J 3/32*     (2006.01)
    *H04L 27/00*     (2006.01)
    *H04L 27/12*     (2006.01)
    *H04L 67/12*     (2022.01)

(52) U.S. Cl.
    CPC .......... *H04L 27/0014* (2013.01); *H04L 27/12* (2013.01); *H04L 67/12* (2013.01)

(58) Field of Classification Search
    CPC ......... H04L 27/12; H04L 67/12; H04L 67/02; H04L 67/125; Y04S 40/18
    USPC ....................................................... 700/287
    See application file for complete search history.

(56) References Cited

U.S. PATENT DOCUMENTS

2018/0088545 A1*   3/2018   Fuchs ................... G05B 15/02
2018/0367320 A1*  12/2018   Montalvo ........... H04L 12/2803

* cited by examiner

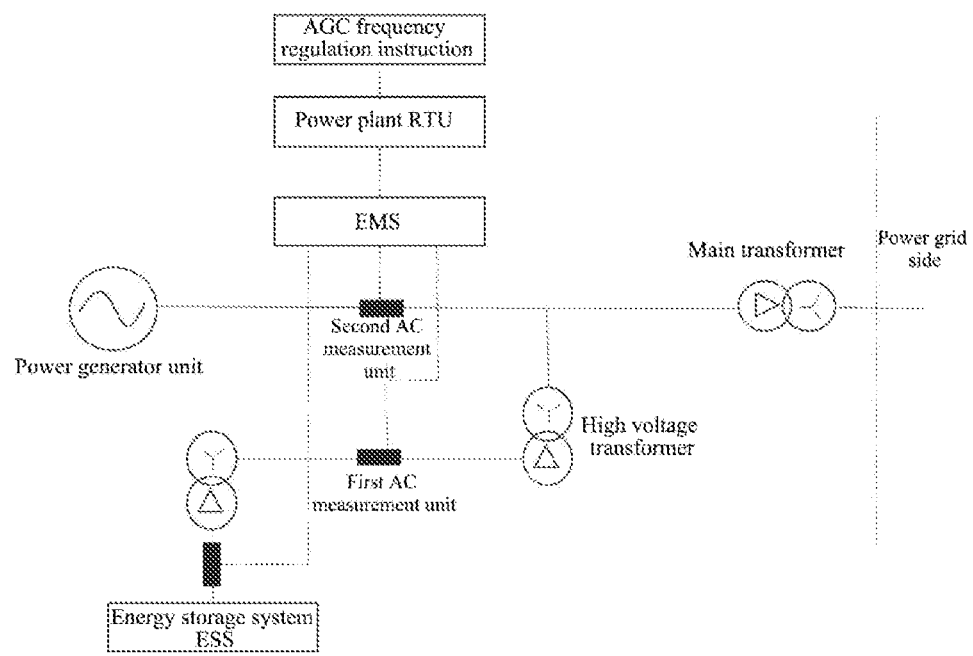

SIGNAL MEASUREMENT METHOD FOR ENERGY STORAGE AND FREQUENCY MODULATION SYSTEM

TECHNICAL FIELD

The present invention relates to electrical signal measurement, specifically a signal measurement method for energy storage and frequency modulation system.

BACKGROUND TECHNOLOGY

Power supply systems include power grids, power generators for generating electricity and a variety of power consuming appliances. The power supply systems, however, when disturbed, may lose stability or enter an abnormal running status when there is something irregular, such as equipment overload, nonsynchronous running and frequency and voltage abnormality. The generator units shall manage output according to system frequencies to maintain a power supply system frequency of 50 Hz. Frequent adjustment of the generator units will result in increased wearing and low efficiency thereof. An energy storage system can be introduced to help the generator units to respond quickly to frequency regulation signals to maintain system frequencies while reduce wearing of the generator units.

Among the prior art, after introduction of the energy storage system, current RTU equipment shall be furnished with signals to send frequency adjusting instructions to a general control unit of the energy storage system when sending frequency adjusting instructions to the generator units. In the meantime, after introduction of the energy storage system, it is necessary to combine the generator unit output and the energy storage system output, upload combined output signals to the power grid to replace the generator unit output signals uploaded and sent to the power grid management system by an original generator system and serve as frequency regulation basis.

So the following modifications shall be done to the RTU: 1. Superimposing the output signals of the power generator units and the output signals of the energy storage devices as feedback output signals of the generator units (a name of the signal telemetering location that passes signals back to the power grid remains unchanged, and no new signal telemetering location is added). 2. Communicating the control system of energy storage system with the RTU under appointed protocol, (one way, sent from the RTU station, and received by the energy storage system general control unit) to acquire real time running data. It is to be solved how to avoid modifying the RTU substantially and promise normal running of the system after introduction of the energy storage system.

SUMMARY OF THE INVENTION

A purpose of the present invention is to solve the foregoing problems and provide a signal measurement method for energy storage and frequency modulation system.

The foregoing purpose of the present invention is to be solved with the following technical solution: a signal measurement method for energy storage and frequency modulation system, comprising following steps:

Step 1: receiving an AGC (Automatic Generation Control) frequency regulation instruction(s) from a balancing authority of a RTU (Remote Terminal Unit) with an energy management system under IEC 104 protocol;

Step 2: sending by the energy management system the AGC frequency regulation instruction(s) to a DCS (Distributed Control System) system and an energy storage PCS (Power Conditioning System) of (a) power generator unit(s);

Step 3: collecting voltage data signals and current data signals by (an) IO acquisition device(s) with the energy management system;

Step 4: multiplying the voltage data signals and the current data signals to get output signals of the power generator unit(s);

Step 5: collecting data signals at a direct current side of an energy storage system by the IO acquisition device(s) with the energy management system;

Step 6: collecting data signals at an alternating current side of the energy storage system by the IO acquisition device(s) (ADAM-6050-00) with the energy management system;

Step 7: multiplying voltage data signals and current data signals to get output signals of the energy storage system;

Step 8: adding the output signals of the power generator unit(s) and the output signals of the energy storage system to get total output signals; and Step 9: uploading the total output signals with the RTU to the balancing authority of a power grid as a feedback of the AGC frequency regulation instruction(s) with the energy management system; and Wherein, a model of the IO acquisition device(s) is ADAM-6050-00.

As a further solution of the present invention, the energy management system comprises (a) microgrid controller(s), an energy management server, a working station and network devices; communication is established between the microgrid controller(s) and the energy management server and the energy management server collects convergence ports on the microgrid controller(s) that report data, the microgrid controller(s) is/are connected with the working station by means of (a) local area network switch(es), and the microgrid controller(s), the energy management server and the working station communicate by (a) network device (s).

Wherein, the microgrid controller(s) is/are core secondary equipment integrating protection, safety and stability control, economic running control, electric quality monitoring and cloud interactive; as for protection, the microgrid controller(s) provide(s) a variety of alternating current and direct current protection functions including AC side of four quadrant power convertor protection, direct current bus protection, and direct current line protection; as for safety and stability control, the microgrid controller(s) is/are provided with a variety of safety and stability control functions such as grid-connected/islanded seamless transition, underfrequency and undervoltage load shedding, and high frequency and high voltage separation; as for economic running control, the microgrid controller(s) can utilize a variety of new energy economic running strategies such as load shifting, which can be combined with time of use pricing to realize optimal output of distributed energy, and improve general running economic efficiency; as for electric quality monitoring, the microgrid controller(s) can monitor online, record and transmits information of a plurality of energy quality indicators; and as for cloud interactive, the microgrid controller(s) support(s) plug and play described in (an) IEC61850 model(s), support(s) corresponding protocols of standard IEC60870-5.

The energy management server communicates with the microgrid controller(s), collects the convergence ports of the microgrid controller(s) that report data, and receives at the same time connection and data processing of a plurality of microgrid controllers; a Web program publishing server is a server that deploys and publishes pages of an energy management and monitoring system, a client side computer requests a page program of the Web program publishing server by http and monitors in real time a system status with a Web client browser, the energy management server and the Web program publishing server can be the same server, a data center server is a server that promises subsequent system stability, and guarantees system reliability, when there are a large number of equipment and a lot of data processing tasks, the data center server is used for load balancing, to monitor all active equipment servers, when it is necessary to establish communication in case of centralized control demand, first of all apply to the data center server to obtain (an) equipment service end(s); secondly the data center server returns corresponding information of (a) current service end(s) according to the centralized control demand; and finally the centralized control establishes communication with the service end(s), and in the meantime, the data center server updates a status of the service end(s) (connected or interrupted) by heartbeat messages, and a usage rate of CPU and internal storage; Main computers of the working station are to monitor system software running, loading by a browser and running a Web client side program for system monitoring; The network devices are used for internal communication in the energy management system with one or more networks, data are transmitted by one or more internal networks, each port of the switch(es) is connected to an independent network segment, and one or more important network computers are directly connected to one or more ports of the switch(es); As a further solution of the present invention, the energy management system comprises following steps:

(1) Collecting key running parameters of lower layer equipment, for example, equipment related signals such as real time equipment status, running voltage, current, and power failure warning, with the centralized control;
(2) Transmitting foregoing data by wireless communication or wired internal networks in real time to a background service system, which will analyze and store the data and distribute service by one or more front-end processors, for calling and showing by (an) upper layer client end(s);
(3) One or more users can check in real time a plurality of equipment digital and analog signals such as equipment running status and equipment running data.

As a further solution of the present invention, the energy management system further comprises one or more power generator units, one or more power plant high voltage transformers, one or more main transformers, an energy storage battery system and one or more energy storage step-up transformers. Energy storage direct current electricity is transformed to be alternating electricity, and integrated into a low voltage side of the power plant high voltage transformers by the energy storage step-up transformers, high voltage sides of the power plant high voltage transformers is connected with the power generator units and connected to a power grid by the main transformers, the power generator units are connected to low voltage sides of the main transformers with main enclosed busbars, measuring units provided for the energy storage battery system are one or more direct current measuring units and alternating current measuring units, the alternating current measuring units comprise one or more first alternating current measuring units and one or more second alternating current measurement units, and the second alternating current measurement units measure electrical signals such as current and voltage at outlets of the power generator units by one or more current transformers CT for collecting current signals and one or more potential transformers PT for collecting voltage signals; the first alternating current measurement units measure electrical signals such as current and voltage at outlets of the energy storage high voltage transformers by one or more current transformers CT for collecting current signals and one or more potential transformers PT for collecting voltage signals; and the direct current measurement units are connected with the PCS so as to receive direct current output from the energy storage system and upload the same to the energy management system.

As a further solution of the present invention, making conformity calculation for collected data with software in a background of the energy storage system, uploading the output to a RTU telemechanical apparatus of a power plant, wherein real time direct current output of the energy storage system is collected from the PCS by direct current measurement, and real time output of the power generator units is acquired by the current and the voltage measured by the CT and the PT devices of the second alternating current measurement units:

$$P_G = U_G * I_G$$

Real time output of the energy storage system is calculated with the current and the voltage measured by the CT and the PT devices in the first alternating current measurement units:

$$P_{ESS} = U_{ESS} * I_{ESS}$$

An output difference between alternating current output and direct current output of the energy storage system is:

$$P_{dif} = P_{ESS} - P_{PCS}$$

$P_{dif}$ is stored in the background of the energy storage system, and used for calculating loss of the energy storage step-up transformers, and reflecting problems existing with the energy storage step-up transformers by a variation amount of $P_{dif}$, and total output of the power generator units and the energy storage system is:

$$P_{SUM} = P_G + P_{ESS}$$

Signals of the total output are uploaded to the RTU of the power plant, and transmitted to a power grid balancing system by the RTU to serve as signals to respond to the AGC frequency regulation instruction(s), and realize efficient monitoring and regulation of the total output of the entire system with the power grid balancing system.

Beneficial effects of the present invention: the signal measurement method for energy storage and frequency modulation system is reasonably designed, an energy storage system is introduced to the power plant high voltage transformers to serve as an auxiliary power output apparatus to satisfy and assist in frequency regulation demands, raise a response indicator Kp value to the balancing AGC instructions, signal rendering and retrieval after introduction of the energy storage system is realized, and a target of frequency adjusting running of the energy storage auxiliary generator units is done without making a substantial modification to the RTU.

BRIEF DESCRIPTION OF THE DRAWINGS

FIG. 1 is a flowchart diagram of the present invention.

EMBODIMENTS

Hereinafter a clear and complete description will be given to technical solutions in embodiments of the present invention in combination with accompanying drawings in embodiments of the present invention, apparently, the embodiments described here are only some rather than all embodiments of the present invention. All other embodiments obtained by those of ordinary skill in the art based on the embodiments provided in the present invention without making any creative effort fall into protection scope of the present invention.

Please refer to FIG. 1, a signal measurement method for energy storage and frequency modulation system, comprising following steps:

Step 1: receiving an AGC (Automatic Generation Control) frequency regulation instruction(s) from a balancing authority of a RTU (Remote Terminal Unit) with an energy management system under IEC 104 protocol;

Step 2: sending by the energy management system the AGC frequency regulation instruction(s) to a DCS (Distributed Control System) system and an energy storage PCS (Power Conditioning System) of (a) power generator unit(s);

Step 3: collecting voltage data signals and current data signals by (an) TO acquisition device(s) with the energy management system;

Step 4: multiplying the voltage data signals and the current data signals to get output signals of the power generator unit(s);

Step 5: collecting data signals at a direct current side of an energy storage system by the TO acquisition device(s) with the energy management system;

Step 6: collecting data signals at an alternating current side of the energy storage system by the TO acquisition device(s) (ADAM-6050-00) with the energy management system;

Step 7: multiplying voltage data signals and current data signals to get output signals of the energy storage system;

Step 8: adding the output signals of the power generator unit(s) and the output signals of the energy storage system to get total output signals; and Step 9: uploading the total output signals with the RTU to the balancing authority of a power grid as a feedback of the AGC frequency regulation instruction(s) with the energy management system; and Wherein, a model of the IO collecting device(s) is ADAM-6050-00.

Further, in an embodiment of the present invention, the energy management system comprises (a) microgrid controller(s), an energy management server, a working station and network devices; communication is established between the microgrid controller(s) and the energy management server and the energy management server collects convergence ports on the microgrid controller(s) that report data, the microgrid controller(s) is/are connected with the working station by means of (a) local area network switch(es), and the microgrid controller(s), the energy management server and the working station communicate by (a) network device(s).

Wherein, the microgrid controller(s) is/are core secondary equipment integrating protection, safety and stability control, economic running control, electric quality monitoring and cloud interactive; as for protection, the microgrid controller(s) provide(s) a variety of alternating current and direct current protection functions including AC side of four quadrant power convertor protection, direct current bus protection, and direct current line protection; as for safety and stability control, the microgrid controller(s) is/are provided with a variety of safety and stability control functions such as grid-connected/islanded seamless transition, underfrequency and undervoltage load shedding, and high frequency and high voltage separation; as for economic running control, the microgrid controller(s) can utilize a variety of new energy economic running strategies such as load shifting, which can be combined with time of use pricing to realize optimal output of distributed energy, and improve general running economic efficiency; as for electric quality monitoring, the microgrid controller(s) can monitor online, record and transmits information of a plurality of energy quality indicators; and as for cloud interactive, the microgrid controller(s) support(s) plug and play described in (an) IEC61850 model(s), support(s) corresponding protocols of standard IEC60870-5, so mutual communication with a balancing automation system is convenient, supports a variety of Internet of Things protocols, and can interact with a cloud comprehensive energy management system safely, friendly and economically, so that optimal wide area running is promised. The energy management server communicates with the microgrid controller(s), collects the convergence ports of the microgrid controller(s) that report data, and receives at the same time connection and data processing of a plurality of microgrid controllers; a Web program publishing server is a server that deploys and publishes pages of an energy management and monitoring system, a client side computer requests a page program of the Web program publishing server by http and monitors in real time a system status with a Web client browser, the energy management server and the Web program publishing server can be the same server, a data center server is a server that promises subsequent system stability, and guarantees system reliability, when there are a large number of equipment and a lot of data processing tasks, the data center server is used for load balancing, to monitor all active equipment servers, when it is necessary to establish communication in case of centralized control demand, first of all apply to the data center server to obtain (an) equipment service end(s); secondly the data center server returns corresponding information of (a) current service end(s) according to the centralized control demand; and finally the centralized control establishes communication with the service end(s), and in the meantime, the data center server updates a status of the service end(s) (connected or interrupted) by heartbeat messages, and a usage rate of CPU and internal storage; and advantages of the data center server is that it is possible to send servers that are currently available to the microgrid controller when there is something wrong with the centralized control server at very first time, so as to realize automatic and seamless transition of the servers.

Main computers of the working station are to monitor system software running, loading by a browser and running a Web client side program for system monitoring; and show running data of system equipment friendly upon user operations and background data interaction, and monitor the whole system in real time.

The network devices are used for internal communication in the energy management system with one or more networks, data are transmitted by one or more internal networks, each port of the switch(es) is connected to an independent network segment, and one or more important network computers are directly connected to one or more ports of the switch(es) to provide a quicker access rate;

Further, in an embodiment of the present invention, the energy management system comprises following steps:

(1) Collecting key running parameters of lower layer equipment, for example, equipment related signals such as real time equipment status, running voltage, current, and power failure warning, with the centralized control;

(2) Transmitting foregoing data by wireless communication or wired internal networks in real time to a background service system, which will analyze and store the data and distribute service by one or more front-end processors, for calling and showing by (an) upper layer client end(s);

(3) One or more users can check in real time a plurality of equipment digital and analog signals such as equipment running status and equipment running data.

Further still, in an embodiment of the present invention, the energy management system further comprises one or more power generator units, one or more power plant high voltage transformers, one or more main transformers, an energy storage battery system and one or more energy storage step-up transformers. Energy storage direct current electricity is transformed to be alternating electricity, and integrated into a low voltage side of the power plant high voltage transformers by the energy storage step-up transformers, high voltage sides of the power plant high voltage transformers is connected with the power generator units and connected to a power grid by the main transformers, the power generator units are connected to low voltage sides of the main transformers with main enclosed busbars, measuring units provided for the energy storage battery system are one or more direct current measuring units and alternating current measuring units, the alternating current measuring units comprise one or more first alternating current measuring units and one or more second alternating current measurement units, and the second alternating current measurement units measure electrical signals such as current and voltage at outlets of the power generator units by one or more current transformers CT for collecting current signals and one or more potential transformers PT for collecting voltage signals; the first alternating current measurement units measure electrical signals such as current and voltage at outlets of the energy storage high voltage transformers by one or more current transformers CT for collecting current signals and one or more potential transformers PT for collecting voltage signals; and the direct current measurement units are connected with the PCS so as to receive direct current output from the energy storage system and upload the same to the energy management system.

Further, in an embodiment of the present invention, making conformity calculation for collected data with software in a background of the energy storage system, uploading the output to a RTU telemechanical apparatus of a power plant, wherein real time direct current output of the energy storage system is collected from the PCS by direct current measurement, and real time output of the power generator units is acquired by the current and the voltage measured by the CT and the PT devices of the second alternating current measurement units:

$$P_G = U_G * I_G$$

Real time output of the energy storage system is calculated with the current and the voltage measured by the CT and the PT devices in the first alternating current measurement units:

$$P_{ESS} = U_{ESS} * I_{ESS}$$

An output difference between alternating current output and direct current output of the energy storage system is:

$$P_{dif} = P_{ESS} - P_{PCS}$$

$P_{dif}$ is stored in the background of the energy storage system, and used for calculating loss of the energy storage step-up transformers, and reflecting problems existing with the energy storage step-up transformers by a variation amount of $P_{dif}$, and total output of the power generator units and the energy storage system is:

$$P_{SUM} = P_G + P_{ESS}$$

Signals of the total output are uploaded to the RTU of the power plant, and transmitted to a power grid balancing system by the RTU to serve as signals to respond to the AGC frequency regulation instruction(s), and realize efficient monitoring and regulation of the total output of the entire system with the power grid balancing system.

Working principles: during using the signal measurement method for energy storage and frequency modulation system, the power grid balancing system sends AGC frequency regulation signals to a RTU telemechanical device of the power plant under power plant protocols, sending the output signals to a DCS system of the power generator unit (a data center server) and a PCS system of the energy storage system by the energy management system, so as to change output of the power generator unit and the energy storage system to satisfy the AGC (Automatic Generation Control) frequency regulation instructions (energy management system). The energy management system receives data signals from three measurement units by optical fibers, and by the real time output of the energy storage system received by the direct current measurement unit and the real time output of the energy storage system received by the first measurement units, loss of the energy storage step-up transformers can be determined and by the loss problems existing with the energy storage step-up transformers can be simulated. Total output signals of the generation ends of the entire power plant can be known by the real time output data signals of the power generator units measured by the first alternating current measurement units and the second measurement units. Upload the signals to the RTU by the energy management system and send to the power grid balancing system, so the energy management system receives data signals from three measurement units by optical fibers, and by the real time output of the energy storage system received by the direct current measurement unit and the real time output of the energy storage system received by the first measurement unit, loss of the energy storage step-up transformers can be calculated and problems existing with the energy storage step-up transformers can be simulated. By the real time output data signals of the power generation units from the first alternating current measurement units and the second measurement units, signals of total output of the power generation units at a power generation end of the power plant can be known, upload the signals to the RTU by the energy management system and send to the power grid balancing system. By the foregoing process, response to the AGC frequency regulation instructions of the power grid can be done.

For those skilled in the art, apparently the present invention is not limited to details in foregoing exemplary embodiments, and without departing from the spirit and basic features of the present invention, the present invention can be realized by other specific means. Therefore, from any point of view, the embodiments shall be taken as exemplary rather than restrictive, and scope of the present invention is defined by the appended claims rather than the foregoing description, thus it is intended that all modifications falling into content and scope of equivalent parts of the claims are included in the present invention. Any drawing reference signs in the claims should not be regarded as limiting the claims involved.

Furthermore, it shall be understood that, although the present invention is described by embodiments, not every embodiment includes only one independent technical solution, narration of the specification is for sake of clarity, and those skilled in the art shall regard the specification as a whole, and technical solutions in each embodiment can be combined as appropriate to form other embodiments that those skilled in the art can understand.

The invention claimed is:

1. A signal measurement method for energy storage and frequency modulation system, comprising following steps:
   step 1: receiving an AGC (Automatic Generation Control) frequency regulation instruction(s) from a balancing authority of a RTU (Remote Terminal Unit) with an energy management system under IEC 104 protocol;
   step 2: sending by the energy management system the AGC frequency regulation instruction(s) to a DCS (Distributed Control System) system and an energy storage PCS (Power Conditioning System) of (a) power generator unit(s);
   step 3: collecting voltage data signals and current data signals by (an) IO acquisition device(s) with the energy management system;
   step 4: multiplying the voltage data signals and the current data signals to get output signals of the power generator unit(s);
   step 5: collecting data signals at a direct current side of an energy storage system by the IO acquisition device(s) with the energy management system;
   step 6: collecting data signals at an alternating current side of the energy storage system by the IO acquisition device(s) with the energy management system;
   step 7: multiplying voltage data signals and current data signals to get output signals of the energy storage system;
   step 8: adding the output signals of the power generator unit(s) and the output signals of the energy storage system to get total output signals; and
   step 9: uploading the total output signals with the RTU to the balancing authority of a power grid as a feedback of the AGC frequency regulation instruction(s) with the energy management system; and
   wherein, a model of the IO acquisition device(s) is ADAM-6050-00; wherein the energy management system comprises (a) microgrid controller(s), an energy management server, a working station and network devices; communication is established between the microgrid controller(s) and the energy management server and the energy management server collects convergence ports on the microgrid controller(s) that report data, the microgrid controller(s) is/are connected with the working station by means of (a) local area network switch(es), and the microgrid controller(s), the energy management server and the working station communicate by (a) network device(s);
   wherein, the microgrid controller(s) is/are core secondary equipment integrating protection, safety and stability control, economic running control, electric quality monitoring and cloud interactive; as for protection, the microgrid controller(s) provide(s) a variety of alternating current and direct current protection functions including AC side of four quadrant power convertor protection, direct current bus protection, and direct current line protection; as for safety and stability control, the microgrid controller(s) is/are provided with a variety of safety and stability control functions such as grid-connected/islanded seamless transition, underfrequency and undervoltage load shedding, and high frequency and high voltage separation; as for economic running control, the microgrid controller(s) can utilize a variety of new energy economic running strategies such as load shifting, which can be combined with time of use pricing to realize optimal output of distributed energy, and improve general running economic efficiency; as for electric quality monitoring, the microgrid controller(s) can monitor online, record and transmits information of a plurality of energy quality indicators; and as for cloud interactive, the microgrid controller(s) support(s) plug and play described in (an) IEC61850 model(s), support(s) corresponding protocols of standard IEC60870-5;
   the energy management server communicates with the microgrid controller(s), collects the convergence ports of the microgrid controller(s) that report data, and receives at the same time connection and data processing of a plurality of microgrid controllers; a Web program publishing server is a server that deploys and publishes pages of an energy management and monitoring system, a client side computer requests a page program of the Web program publishing server by http and monitors in real time a system status with a Web client browser, the energy management server and the Web program publishing server can be the same server, a data center server is a server that promises subsequent system stability, and guarantees system reliability, when there are a large number of equipment and a lot of data processing tasks, the data center server is used for load balancing, to monitor all active equipment servers, when it is necessary to establish communication in case of centralized control demand, first of all apply to the data center server to obtain (an) equipment service end(s); secondly the data center server returns corresponding information of (a) current service end(s) according to the centralized control demand; and finally the centralized control establishes communication with the service end(s), and in the meantime, the data center server updates a status of the service end(s) (connected or interrupted) by heartbeat messages, and a usage rate of CPU and internal storage;
   main computers of the working station are to monitor system software running, loading by a browser and running a Web client side program for system monitoring; and
   the network devices are used for internal communication in the energy management system with one or more networks, data are transmitted by one or more internal networks, each port of the switch(es) is connected to an independent network segment, and one or more important network computers are directly connected to one or more ports of the switch(es).

2. The signal measurement method for energy storage and frequency modulation system according to claim 1, wherein, the energy management system comprises following steps:
(1) collecting key running parameters of lower layer equipment, for example, equipment related signals such as real time equipment status, running voltage, current, and power failure warning, with the centralized control;
(2) transmitting foregoing data by wireless communication or wired internal networks in real time to a background service system, which will analyze and store the data and distribute service by one or more front-end processors, for calling and showing by (an) upper layer client end(s); and
(3) one or more users can check in real time a plurality of equipment digital and analog signals such as equipment running status and equipment running data.

3. The signal measurement method for energy storage and frequency modulation system according to claim 1, wherein the energy management system further comprises one or more power generator units, one or more power plant high voltage transformers, one or more main transformers, an energy storage battery system and one or more energy storage step-up transformers, Energy storage direct current electricity is transformed to be alternating electricity, and integrated into a low voltage side of the power plant high voltage transformers by the energy storage step-up transformers, high voltage sides of the power plant high voltage transformers is connected with the power generator units and connected to a power grid by the main transformers, the power generator units are connected to low voltage sides of the main transformers with main enclosed busbars, measuring units provided for the energy storage battery system are one or more direct current measuring units and alternating current measuring units, the alternating current measuring units comprise one or more first alternating current measuring units and one or more second alternating current measurement units, and the second alternating current measurement units measure electrical signals such as current and voltage at outlets of the power generator units by one or more current transformers CT for collecting current signals and one or more potential transformers PT for collecting voltage signals; the first alternating current measurement units measure electrical signals such as current and voltage at outlets of the energy storage high voltage transformers by one or more current transformers CT for collecting current signals and one or more potential transformers PT for collecting voltage signals; and the direct current measurement units are connected with the PCS so as to receive direct current output from the energy storage system and upload the same to the energy management system.

4. The signal measurement method for energy storage and frequency modulation system according to claim 3, wherein making conformity calculation for collected data with software in a background of the energy storage system, uploading the output to a RTU telemechanical apparatus of a power plant, wherein real time direct current output of the energy storage system is collected from the PCS by direct current measurement, and real time output of the power generator units is acquired by the current and the voltage measured by the CT and the PT devices of the second alternating current measurement units:

$$P_G = U_G * I_G$$

Real time output of the energy storage system is calculated with the current and the voltage measured by the CT and the PT devices in the first alternating current measurement units:

$$P_{ESS} = U_{ESS} * I_{ESS}$$

An output difference between alternating current output and direct current output of the energy storage system is:

$$P_{dif} = P_{ESS} - P_{PCS}$$

$P_{dif}$ is stored in the background of the energy storage system, and used for calculating loss of the energy storage step-up transformers, and reflecting problems existing with the energy storage step-up transformers by a variation amount of $P_{dif}$, and total output of the power generator units and the energy storage system is:

$$P_{SUM} = P_G + P_{ESS}$$

Signals of the total output are uploaded to the RTU of the power plant, and transmitted to a power grid balancing system by the RTU to serve as signals to respond to the AGC frequency regulation instruction(s), and realize efficient monitoring and regulation of the total output of the entire system with the power grid balancing system.

5. The signal measurement method for energy storage and frequency modulation system according to claim 2, wherein the energy management system further comprises one or more power generator units, one or more power plant high voltage transformers, one or more main transformers, an energy storage battery system and one or more energy storage step-up transformers, Energy storage direct current electricity is transformed to be alternating electricity, and integrated into a low voltage side of the power plant high voltage transformers by the energy storage step-up transformers, high voltage sides of the power plant high voltage transformers is connected with the power generator units and connected to a power grid by the main transformers, the power generator units are connected to low voltage sides of the main transformers with main enclosed busbars, measuring units provided for the energy storage battery system are one or more direct current measuring units and alternating current measuring units, the alternating current measuring units comprise one or more first alternating current measuring units and one or more second alternating current measurement units, and the second alternating current measurement units measure electrical signals such as current and voltage at outlets of the power generator units by one or more current transformers CT for collecting current signals and one or more potential transformers PT for collecting voltage signals; the first alternating current measurement units measure electrical signals such as current and voltage at outlets of the energy storage high voltage transformers by one or more current transformers CT for collecting current signals and one or more potential transformers PT for collecting voltage signals; and the direct current measurement units are connected with the PCS so as to receive direct current output from the energy storage system and upload the same to the energy management system.

6. The signal measurement method for energy storage and frequency modulation system according to claim 5, wherein making conformity calculation for collected data with software in a background of the energy storage system, uploading the output to a RTU telemechanical apparatus of a power plant, wherein real time direct current output of the energy storage system is collected from the PCS by direct current measurement, and real time output of the power generator units is acquired by the current and the voltage measured by the CT and the PT devices of the second alternating current measurement units:

$$P_G = U_G * I_G$$

Real time output of the energy storage system is calculated with the current and the voltage measured by the CT and the PT devices in the first alternating current measurement units:

$$P_{ESS} = U_{ESS} * I_{ESS}$$

An output difference between alternating current output and direct current output of the energy storage system is:

$$P_{dif} = P_{ESS} - P_{PCS}$$

$P_{dif}$ is stored in the background of the energy storage system, and used for calculating loss of the energy storage step-up transformers, and reflecting problems existing with the energy storage step-up transformers by a variation amount of $P_{dif}$, and total output of the power generator units and the energy storage system is:

$$P_{SUM} = P_G + P_{ESS}$$

Signals of the total output are uploaded to the RTU of the power plant, and transmitted to a power grid balancing system by the RTU to serve as signals to respond to the AGC frequency regulation instruction(s), and realize efficient monitoring and regulation of the total output of the entire system with the power grid balancing system.

\* \* \* \* \*